(12) United States Patent
Skoropinski et al.

(10) Patent No.: US 10,915,671 B2
(45) Date of Patent: Feb. 9, 2021

(54) METHODS AND SYSTEMS FOR PROCESSING BUILDING INFORMATION MODELING (BIM)-BASED DATA

(71) Applicant: Viewpoint, Inc., Portland, OR (US)

(72) Inventors: Laurence Skoropinski, Durham (GB); Lloyd Pickering, Durham (GB); Richard Stokoe, Tyne and Wear (GB)

(73) Assignee: VIEWPOINT, INC., Portland, OR (US)

( * ) Notice: Subject to any disclaimer, the term of this patent is extended or adjusted under 35 U.S.C. 154(b) by 0 days.

(21) Appl. No.: 16/664,586

(22) Filed: Oct. 25, 2019

(65) Prior Publication Data
US 2020/0057829 A1 Feb. 20, 2020

Related U.S. Application Data

(63) Continuation of application No. 14/491,844, filed on Sep. 19, 2014, now Pat. No. 10,474,765.

(Continued)

(51) Int. Cl.
*G06F 30/13* (2020.01)
*G06F 16/21* (2019.01)
(Continued)

(52) U.S. Cl.
CPC ............ *G06F 30/13* (2020.01); *A01F 1/00* (2013.01); *G06F 3/04815* (2013.01);
(Continued)

(58) Field of Classification Search
CPC ....... H04L 67/14; H04L 67/141; H04L 67/42; H04L 65/1066; H04L 65/1069; G06F 30/13; G06F 2111/02; G06Q 50/08
See application file for complete search history.

(56) References Cited

U.S. PATENT DOCUMENTS 8,306,883 B2 11/2012 Allin et al.
8,400,467 B1 3/2013 Ponce de Leon
(Continued)

FOREIGN PATENT DOCUMENTS

DE 102009053585 5/2010
DE 102009016588 10/2010
(Continued)

OTHER PUBLICATIONS

"Demystifying COBie Standards and How to Integrate Them into BIM Based Applications," YouTube Video Uploaded by FaitechWebinars on Jun. 6, 2012, https://www,youtube,com/watch?v=vf010XZ_7-Y, 2 pages.

(Continued)

*Primary Examiner* — Brian W Wathen
(74) *Attorney, Agent, or Firm* — Perkins Coie LLP

(57) ABSTRACT

A method for operating a building information modeling (BIM) system, is provided. The method includes at a BIM server, receiving a data alteration request from a client computing device for altering data in one of a building model, a hierarchical structure of building model data, and a Construction Operations Building Information Exchange (COBie) spreadsheet, the building model, hierarchical structure of building model data, and COBie spreadsheet simultaneously displayed in a GUI generated by the BIM server, automatically determining validity of data in the data alteration request, and if it is determined that the data is valid, permitting the data alteration request based on predetermined permissions of the client computing device.

20 Claims, 12 Drawing Sheets

Related U.S. Application Data

(60) Provisional application No. 61/880,370, filed on Sep. 20, 2013.

(51) Int. Cl.
*G06F 40/18* (2020.01)
*H04L 29/08* (2006.01)
*H04L 29/06* (2006.01)
*A01F 1/00* (2006.01)
*G06F 3/0481* (2013.01)
*G06F 3/0484* (2013.01)

(52) U.S. Cl.
CPC .......... *G06F 3/04842* (2013.01); *G06F 16/21* (2019.01); *G06F 40/18* (2020.01); *H04L 65/1069* (2013.01); *H04L 67/10* (2013.01); *H04L 67/141* (2013.01); *H04L 67/42* (2013.01)

(56) References Cited

U.S. PATENT DOCUMENTS

| | | |
|---|---|---|
| 8,438,199 B1 | 5/2013 | Cleveland et al. |
| 8,473,470 B1 | 6/2013 | Cook, Jr. et al. |
| 8,504,292 B1 | 8/2013 | Cote et al. |
| 2001/0047251 A1 | 11/2001 | Kemp |
| 2002/0183878 A1* | 12/2002 | Chartier ........... G05B 19/41805 700/98 |
| 2003/0023473 A1 | 1/2003 | Guyan |
| 2003/0101098 A1 | 5/2003 | Schaarschmidt |
| 2003/0217275 A1 | 11/2003 | Bentley |
| 2004/0226002 A1 | 11/2004 | Larcheveque |
| 2004/0236711 A1 | 11/2004 | Nixon et al. |
| 2004/0236754 A1 | 11/2004 | Workman et al. |
| 2005/0188348 A1 | 8/2005 | Han et al. |
| 2005/0246216 A1 | 11/2005 | Rosen et al. |
| 2005/0288808 A1 | 12/2005 | Lopez et al. |
| 2006/0074608 A1 | 4/2006 | Clay et al. |
| 2006/0074609 A1 | 4/2006 | Freeman et al. |
| 2006/0085322 A1 | 4/2006 | Crookshanks |
| 2006/0271477 A1 | 11/2006 | Allin et al. |
| 2007/0061154 A1 | 3/2007 | Markvoort et al. |
| 2007/0061428 A1 | 3/2007 | Haley |
| 2007/0186094 A1 | 8/2007 | Ghantous et al. |
| 2007/0186149 A1 | 8/2007 | Ghantous et al. |
| 2007/0239410 A1 | 10/2007 | Seppanen et al. |
| 2007/0265963 A1 | 11/2007 | Allin et al. |
| 2007/0285424 A1 | 12/2007 | Cheng et al. |
| 2007/0288207 A1 | 12/2007 | Backe et al. |
| 2008/0172208 A1 | 7/2008 | Lechine |
| 2008/0234987 A1 | 9/2008 | Haley |
| 2008/0238918 A1 | 10/2008 | Culver et al. |
| 2008/0281735 A1 | 11/2008 | Allin et al. |
| 2009/0144320 A1 | 6/2009 | Weinberg |
| 2009/0204373 A1 | 8/2009 | Brown et al. |
| 2010/0106654 A1 | 4/2010 | Simpson et al. |
| 2010/0153280 A1 | 6/2010 | Fox et al. |
| 2010/0153293 A1 | 6/2010 | Fox et al. |
| 2010/0257485 A1 | 10/2010 | Ghantous et al. |
| 2010/0281355 A1 | 11/2010 | White et al. |
| 2011/0102463 A1 | 5/2011 | Kaski et al. |
| 2011/0119177 A1 | 5/2011 | Allin et al. |
| 2011/0304628 A1 | 12/2011 | Fu et al. |
| 2012/0022848 A1 | 1/2012 | Suomi et al. |
| 2012/0066178 A1 | 3/2012 | Omansky |
| 2012/0116728 A1 | 5/2012 | Shear et al. |
| 2012/0130521 A1 | 5/2012 | Kohlhoff |
| 2012/0191604 A1 | 7/2012 | Allin et al. |
| 2012/0197789 A1 | 8/2012 | Allin et al. |
| 2012/0197790 A1 | 8/2012 | Allin et al. |
| 2012/0203806 A1* | 8/2012 | Panushev ................ G06Q 10/06 707/825 |
| 2012/0239886 A1 | 9/2012 | Rantanen |
| 2012/0278334 A1 | 11/2012 | Abjanic |
| 2012/0284178 A1 | 11/2012 | Allin et al. |
| 2012/0299921 A1 | 11/2012 | Budge et al. |
| 2012/0303499 A1 | 11/2012 | Allin et al. |
| 2012/0310802 A1 | 12/2012 | Allin et al. |
| 2013/0013269 A1 | 1/2013 | Martin et al. |
| 2013/0018799 A1 | 1/2013 | Allin et al. |
| 2013/0027385 A1 | 1/2013 | Lorenz et al. |
| 2013/0054485 A1 | 2/2013 | Allin et al. |
| 2013/0103798 A1* | 4/2013 | El Chami ........... H04L 65/4015 709/217 |
| 2013/0120368 A1* | 5/2013 | Miller ................. G06T 19/00 345/419 |
| 2013/0132466 A1* | 5/2013 | Miller ................. G06F 16/972 709/203 |
| 2013/0159833 A1 | 6/2013 | Look et al. |
| 2013/0169681 A1* | 7/2013 | Rasane ................. G06Q 50/10 345/633 |
| 2013/0173229 A1 | 7/2013 | Heikkonen |
| 2013/0181986 A1 | 7/2013 | Fowler et al. |
| 2013/0181987 A1 | 7/2013 | Fowler et al. |
| 2013/0191078 A1 | 7/2013 | Batra et al. |
| 2013/0194275 A1 | 8/2013 | Hrcka |
| 2013/0197868 A1 | 8/2013 | Olsson et al. |
| 2013/0218472 A1 | 8/2013 | Fu et al. |
| 2013/0218924 A1* | 8/2013 | Kim ..................... G06F 30/13 707/770 |
| 2013/0268834 A1 | 10/2013 | Krane et al. |
| 2013/0339078 A1 | 12/2013 | Harris |
| 2014/0143005 A1 | 5/2014 | Jatla |
| 2014/0278271 A1 | 9/2014 | Stevenson |
| 2015/0088916 A1 | 3/2015 | Stokoe |
| 2015/0089344 A1 | 3/2015 | Pickering et al. |

FOREIGN PATENT DOCUMENTS

| | | |
|---|---|---|
| EP | 1255212 | 11/2002 |
| EP | 1255391 | 11/2002 |
| EP | 2629210 | 8/2013 |
| KR | 1020050094643 | 9/2005 |
| KR | 100593716 | 6/2006 |
| KR | 1020060065838 | 6/2006 |
| KR | 1020100020060 | 2/2010 |
| KR | 101105327 | 1/2012 |
| WO | 9618939 | 6/1996 |
| WO | 2013000027 | 1/2013 |
| WO | 2013090942 | 6/2013 |
| WO | 2013090944 | 6/2013 |
| WO | 2013106802 | 7/2013 |

OTHER PUBLICATIONS

"Get Real with BIM," YouTube Video Uploaded by Kimona Onuma on Nov. 13, 2010, https://www.youtube.com/watch?v=RnHPj77lg-A, 2 pages.
"Who will run the world for the next 100 years?: Desmond Wheatley at TEDxAmerciasFinestCity," Youtube Video Uploaded by TEDx Talks on Nov. 4, 2012, https://www.youtube.com/watch?v=FL864c0, 2 pages.
AECMagazine, 4Projects Bim in a Browser (/technology-mainmenu-35/559-4projects-bim-in-a-browser), Apr. 9, 2013, 4 pages.
Beetz, J. et al., "Bimserver.Org—An Open Source IFC Model Server," 27th International Conference Cairo, Egypt, 2010, 8 pages.
Bogen et al., "A Framework for Building Information Fusion," Proceedings of the CIB—International Conference, 2011, 10 pages.
Chuang et al., "Applying Cloud Computing Technology to BIM Visualization and Manipulation," Department of Engineering, National Kaohsiung University of Applied Science, Kaohsiung, Taiwan, 2011, 6 pages.
East et al., "Lightweight Capture of As-Built Construction Information," Managing IT in Construction/Managing Construction for Tomorrow, Taylor and Francis Group, London, 2010, 9 pages.
RIB Software AG, "Integrated Building Information Modeling," 2009, 3 pages.
Singh, Vishal et al., "A Theoretical Framework of a BIM-based Multi-Disciplinary Collaboration Platform," Automation in Construction 20, 2011,.

(56) References Cited

OTHER PUBLICATIONS

Wolfgang Muller, "Construction Process Integration (CPI) Based on Multi-Model Design," Proceedings of the 11th International Conference on Construction Applications of Virtual Reality, Nov. 4, 2011, 8 pages.
ISA Korean Intellectual Property Office, International Search Report and Written Opinion Issued in Application No. PCT/US2014/056597, dated Jan. 2, 2015, WIPO, 10 pages.

* cited by examiner

FIG. 9

| Name | CreatedBy | CreatedOn | TypeName | Space | Description | ExtSystem |
|---|---|---|---|---|---|---|
| 18 | M_Tall Cabinet Single Door(2):800 mm:800:15798 | cskender.unknown@unknown.com | 2013-06-20 | 800mm | A202 | M_Tall Cabinet Single Door(2):800 mm:800:15798 | Autodesk Revit Architectu |
| 19 | M_Tall Cabinet Single Door(2):800 mm:800:15798 | cskender.unknown@unknown.com | 2013-06-20 | 800mm | A202 | M_Tall Cabinet Single Door(2):800 mm:800:15798 | Autodesk Revit Architectu |
| 20 | M_Bed-Standard:1981 x 2032mm King:1981 x 2032 | cskender.unknown@unknown.com | 2013-06-20 | 1981x2032mm - King | A202 | M_Bed-Standard:1981 x 2032mm King:1981 x 2032 | Autodesk Revit Architectu |
| 21 | M_Table-Coffee:0610x 0610mm:1830mm:168377 | cskender.unknown@unknown.com | 2013-06-20 | 0610x0610x0610mm | A102 | M_Table-Coffee:0610x 0610 x 0610mm:0610 x 0610 x | Autodesk Revit Architectu |
| 22 | M_Sofa: 1830mm:1830mm:168377 | cskender.unknown@unknown.com | 2013-06-20 | 1830mm | A102 | M_Sofa: 1830mm:1830mm:168377 | Autodesk Revit Architectu |
| 23 | M_Sofa: 1830mm:1830mm:168378 | cskender.unknown@unknown.com | 2013-06-20 | 1830mm | A102 | M_Sofa: 1830mm:1830mm:168378 | Autodesk Revit Architectu |
| 24 | M_Table-Coffee:0610x 0610mm:0610 x 0610 | cskender.unknown@unknown.com | 2013-06-20 | 0610x 0610x 0610mm | A102 | M_Table-Coffee:0610x 0610 x 0610mm:0610 x 0610 x | Autodesk Revit Architectu |
| 25 | M_Table-Coffee:0610x 0610mm:0610 x 0610 | cskender.unknown@unknown.com | 2013-06-20 | 0610x0610x0610mm | A102 | M_Table-Coffee:0610x 0610 x 0610mm:0610 x 0610 x | Autodesk Revit Architectu |
| 26 | M_Table-Coffee:0915x 1830 x 0457mm:0915x 1830 x | cskender.unknown@unknown.com | 2013-06-20 | 0915 x 1830 x 0457mm | A102 | M_Table-Coffee:0915x 1830 x 0457mm:0915x 1830 x | Autodesk Revit Architectu |
| 27 | M_Sofa: 1830mm:1830mm:167283 | cskender.unknown@unknown.com | 2013-06-20 | 1830mm | B102 | M_Sofa: 1830mm:1830mm:167283 | Autodesk Revit Architectu |
| 28 | M_Sofa: 1830mm:1830mm:167426 | cskender.unknown@unknown.com | 2013-06-20 | 1830mm | B102 | M_Sofa: 1830mm:1830mm:167426 | Autodesk Revit Architectu |
| 29 | M_Table-Coffee:0610x 0610mm:0610 x 0610 | cskender.unknown@unknown.com | 2013-06-20 | 0610x 0610x 0610mm | B102 | M_Table-Coffee:0610x 0610 x 0610mm:0610 x 0610 x | Autodesk Revit Architectu |
| 30 | M_Table-Coffee:0610x 0610mm:0610 x 0610 | cskender.unknown@unknown.com | 2013-06-20 | 0610x 0610x 0610mm | B102 | M_Table-Coffee:0610x 0610 x 0610mm:0610 x 0610 x | Autodesk Revit Architectu |
| 31 | M_Table-Coffee:0915x 1830 x 0457mm:0915x 1830 x | cskender.unknown@unknown.com | 2013-06-20 | 0915 x 1830 x 0457mm | B102 | M_Table-Coffee:0915x 1830 x 0457mm:0915x 1830 x | Autodesk Revit Architectu |
| 32 | M_Skylight:1180 x 1170mm 185337 | cskender.unknown@unknown.com | 2013-06-20 | 1180 x 1170mm | n/a | M_Skylight:1180 x 1170mm:1180 x 1170mm 185337 | Autodesk Revit Architectu |

METHODS AND SYSTEMS FOR PROCESSING BUILDING INFORMATION MODELING (BIM)-BASED DATA

CROSS REFERENCE TO RELATED APPLICATION

This application is a continuation of U.S. patent application Ser. No. 14/491,844, entitled "METHODS AND SYSTEMS FOR PROCESSING BUILDING INFORMATION MODELING (BIM)-BASED DATA" filed Sep. 19, 2014, which claims priority to U.S. provisional patent application, Ser. No. 61/880,370, entitled "PROCESSING BUILDING INFORMATION MODELING (BIM)-BASED DATA" filed on Sep. 20, 2013, the entire disclosure of which is herein incorporated by reference.

FIELD OF THE INVENTION

The present invention relates to managing Building Information Modeling (BIM) based data.

BACKGROUND

Building Information Modeling (BIM) is a digital representation of physical and functional characteristics of a facility. A BIM is a shared knowledge resource for information about a facility forming a reliable basis for decisions during its life-cycle. In addition to the geometry of a facility, BIM data can also describe additional information, such as spatial relationships, light analysis, geographic information, and quantities and properties of building components (for example, manufacturers' details).

It is known to provide collaborative BIM software tools that enable several users, including ones at geographically remote sites, to work on the same BIM-based project (e.g., building model). An example is 4BIM, produced by 4Projects. This can allow any project member to review and interact with 3D building models using a World Wide Web browser. It may be desirable for the users to view other information pertaining to building models, such as COBie data corresponding to specific objects within the model. However, 4BIM does not provide such functionality. Therefore, the users may have to access additional programs to facilitate viewing of other related data, such as COBie data, decreasing user productivity, data management efficiency, etc. Furthermore, a multitude of users may work on a single BIM project and manipulate various aspects of the BIM data. However, users may make errors when manipulating the data. Therefore, some of the data may be invalid. The data errors decrease the reliability of the data in the BIM software which can negatively affect many aspects of building design, construction, and maintenance. 4BIM and other programs do not have the data management tools to determine errors in the data and perform quality analysis.

SUMMARY OF THE INVENTION

A method for operating a building information modeling (BIM) system is provided to overcome some of the aforementioned data management problems in previous BIM systems. The method includes at a BIM server, receiving a data alteration request from a client computing device for altering data in one of a building model, a hierarchical structure of building model data, and a Construction Operations Building Information Exchange (COBie) spreadsheet, the building model, hierarchical structure of building model data, and COBie spreadsheet simultaneously displayed in a GUI generated by the BIM server, automatically determining validity of data in the data alteration request, and if it is determined that the data is valid, permitting the data alteration request based on predetermined permissions of the client computing device. In this way, data in the building model, hierarchical structure of building model data, and/or COBie spreadsheet can be validated to increase the reliability of data changes in the GUI. As a result, management of building design, construction, and/or maintenance is improved.

In one example, the validation may occur in real-time. In this way, a user is able to get nearly instant feedback with regard to their changes and the effect that the changes have on the quality of the COBie data. For example, the user can see that errors and warning counts are reducing and improving when COBie validation is implemented in the system. As a result, the user experience is enhanced. Further in one example, automatically determining validity of data in the data alteration request includes enforcing referential integrity of the data through use of a validation lookup list. In this way, data validation is further improved.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Whilst the invention has been described above, it extends to any inventive combination of features set out above or in the following description. Although illustrative embodiments of the invention are described in detail herein with reference to the accompanying drawings, it is to be understood that the invention is not limited to these precise embodiments. As such, many modifications and variations will be apparent to practitioners skilled in the art. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

BRIEF DESCRIPTION OF THE FIGURES

FIGS. 6-12 show example graphical user interfaces (GUIs) that may be generated and viewed in the BIM system shown in FIG. 2.

DETAILED DESCRIPTION

Aspects of this disclosure will now be described by example and with reference to the illustrated embodiments.

Components and other elements that may be substantially the same in one or more embodiments are identified coordinately and are described with minimal repetition. It will be noted, however, that elements identified coordinately may also differ to some degree. It will be further noted that the drawings included herein are schematic and generally not drawn to scale. Rather, the various drawing scales, aspect ratios, and numbers of components shown in the figures may be purposely distorted to make certain features or relationships easier to see. Therefore, the figures are not intended to be technically precise, but are drawn to ease understanding.

A method for operating a building information modeling (BIM) system is described herein. The method may include determining validity of data in a data alteration request of data in a building model, a hierarchical structure of building model data, and/or Construction Operations Building Information Exchange (COBie) spreadsheet, and if it is determined that the data is valid, permitting the data alteration request based on predetermined permissions of the client computing device. In this way, data changes in one or more of the building model, hierarchical structure, and/or COBie spreadsheet can be validated, increasing the reliability of data changes in the GUI and improving data management in the system. In one example, the validation may occur in real-time. In this way, a user is able to get nearly instant feedback with regard to their changes and the effect that the changes have on the quality of the COBie data. For example, the user can see that errors and warning counts are reducing and improving when COBie validation is implemented in the system. As a result, the user experience is enhanced. Further in one example, automatically determining validity of data in the data alteration request includes enforcing referential integrity of the data through use of a validation lookup list. In this way, data validation is further improved.

Figure 1:
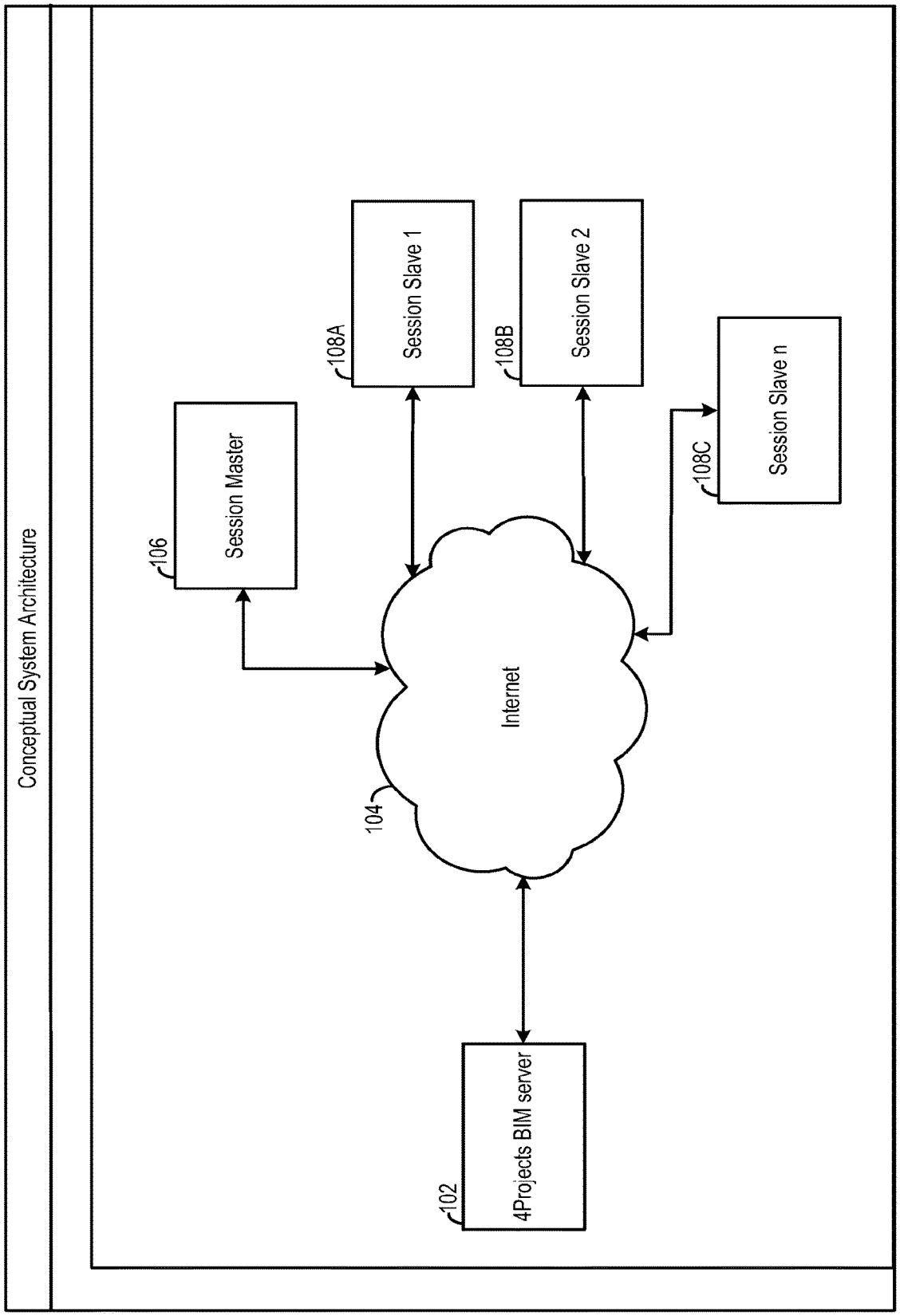
FIG. 1 shows a schematic drawing of a set of computing devices configured to process BIM-based data.

FIG. 1 shows a server computing device 102 connected via a network 104 to a session master computing device 106 and a set of session slave computing devices 108A-108C. Each computing device may comprise at least one conventional computing device including a processor and memory, but it will be understood that the functions performed and the data used could be distributed over a plurality of computing devices and/or storage devices, including a cloud computing arrangement. In practice, the session master and the session slave devices may be similar in terms of hardware and it is the functions performed by the device's user that determines whether they are master or slave devices in the system.

At least the master 106 and slave 108 computing devices will normally have, or be associated with, a display device and user interface device (e.g., keyboard, mouse or graphics tablet, etc.) These components will be well known to the person skilled in the art and are not illustrated or described herein in detail. The communications between the various devices may be via any suitable wired or wireless communication structure (e.g., network). The example shows three slave devices, but it will be understood that any reasonable number could be included in the system.

The server device 102 executes code on its processor that allows it to process building information modeling (BIM)-based data in various ways, such as creating, displaying and/or editing models (e.g., via routines such as those included in the 4BIM package mentioned above) and also transfer related data to and from the master 106 and slave 108 devices over the network 104. It will be understood that "BIM-based data" can include building-related information according to any version and/or format of BIM. The data may be stored using any suitable data structure or arrangement and in some cases may be compressed and/or encrypted for storage and/or transmission.

Figure 4:
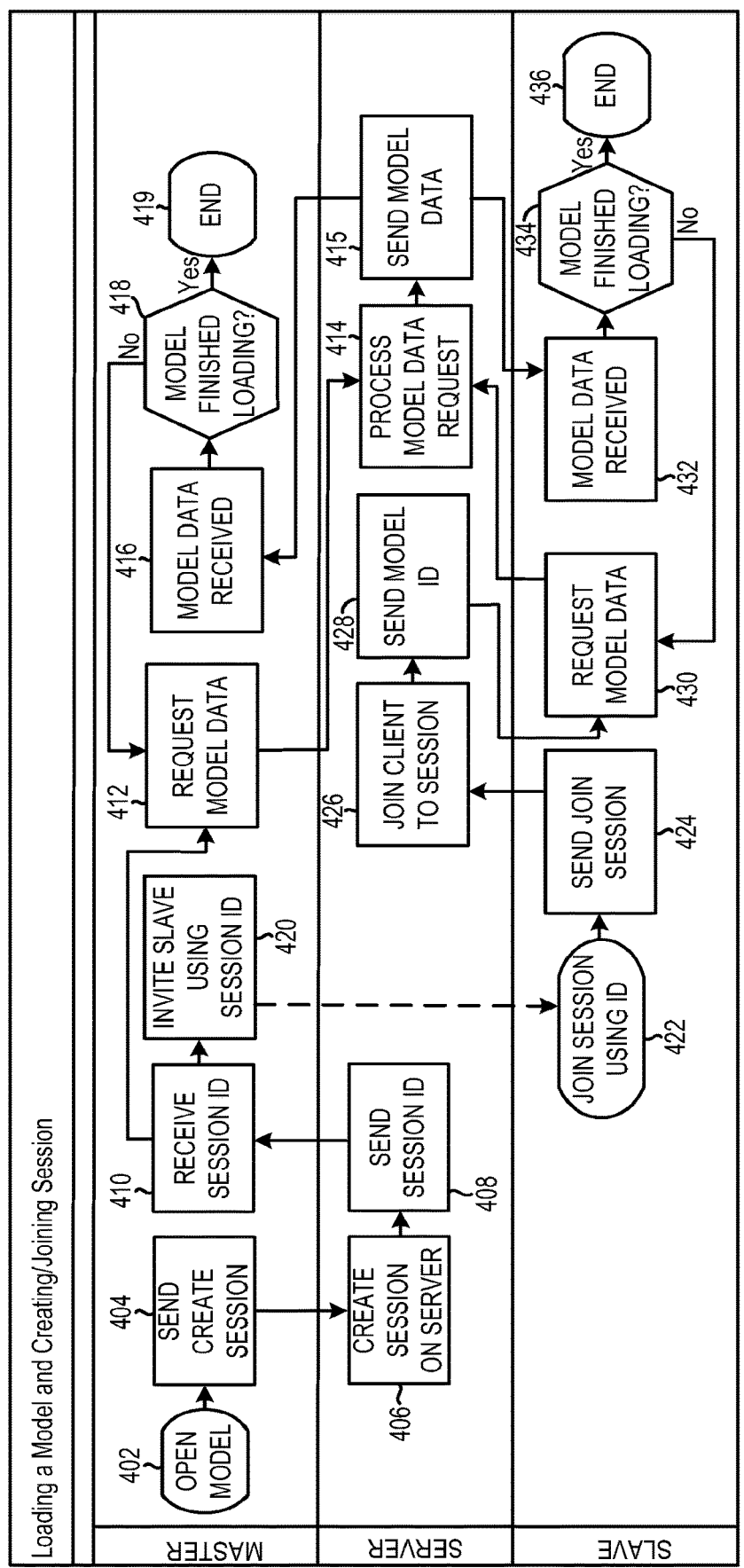
FIG. 4 shows a flowchart showing example steps involved in setting up a session for sharing BIM-based data.

In use, the code stored in memory executed via a processor on the server device 102 can perform steps including loading a model represented by BIM-based data and allowing users of the master 106 and the slave 108 devices to create and join a session relating to the model as illustrated in FIG. 4 as well as the other method described herein. It will be understood that the code and data can be implemented using any suitable programming language(s) and data structures. It will be appreciated that the steps shown in all of the flowcharts herein are exemplary only, and that in alternative embodiments some of them could be omitted, re-ordered or performed concurrently. Additional steps could also be included.

The example implementation detailed herein is based on the server device 102 controlling communication between the master and client computing devices (i.e., 106 and 108a-108c). However, it will be understood that in alternative embodiments, at least some of the functions performed by the server device could be performed by one or more of the master and/or slave devices (e.g., a user could effectively directly use an application running on a master device to exchange data with the slave device(s) without the need for a server).

Figure 2:
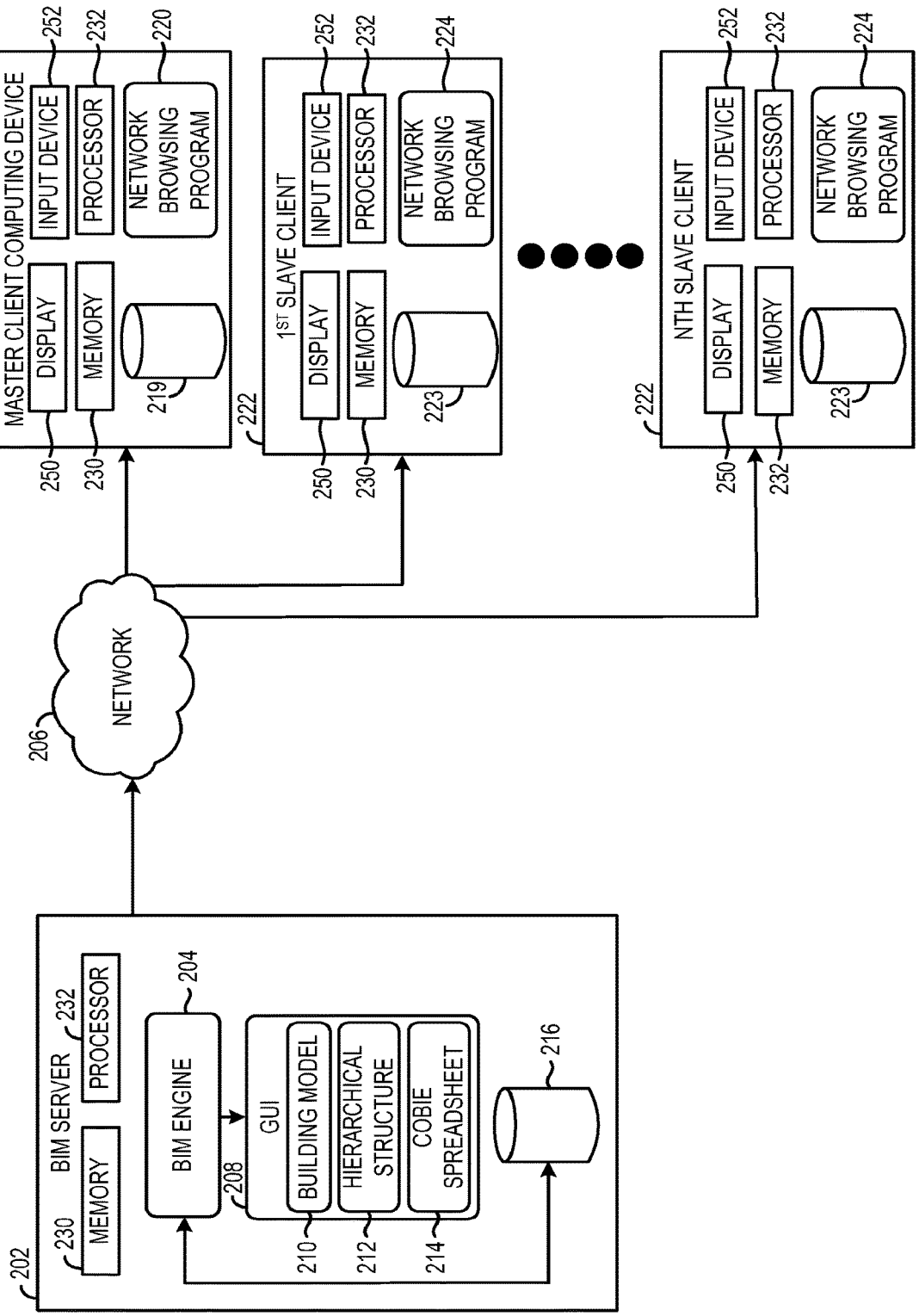
FIG. 2 shows a schematic depiction of a BIM system including a BIM server, master client computing device, and a plurality of slave client computing devices.

FIG. 2 shows a BIM system 200. The BIM system 200 is configured to efficiently manage data with regard to building construction, building operations, and/or building repairs. Thus, the BIM system 200 provides a single platform to manage building data over various stages in the building lifecycle. It will be appreciated that a building may encompass any man made structure or group of structures such as a facility.

The BIM system 200 includes a BIM server 202. The BIM server 202 includes a network-based BIM engine 204. The network-based BIM engine 204 may be configured to manage BIM data and enables client computing devices to access the BIM data over a network 206. The network 206 may be the Internet, in one example. However, other suitable networks have been contemplated such as a local area network (LAN), a wide area network (WAN), a virtual private network (VPN), etc. Specifically, the network-based BIM engine 204 may be configured to generate a graphical user interface (GUI) 208 including each of a building model 210, a hierarchical structure of building model data 212, and a construction operation building information exchange (COBie) spreadsheet 214.

The building model 210 may include a 3-dimensional representation of objects in the building model. The objects may include components, systems, and/or structures in the building. The systems may include heating systems, plumbing systems, cooling systems, and/or electrical systems. Additionally, the structures include one or more of a door, a room, and/or a wall. Additionally, the hierarchical structure of building model data 212 may be a directory structure such as a tree structure including graphical representations of sections, floors, systems, etc., and sub-directories of the sections, floors, systems such as rooms, components, structures, parts, etc., in one example. In this way, a user may easily view a conceptual arrangement of various features of the building.

Furthermore, the COBie spreadsheet 214 may include at least one or more of an equipment list, a product data sheet, a warranty, a spare parts list, and/or a preventative maintenance schedule in a COBie format. It will be appreciated that the COBie spreadsheet may include non-geometric data associated with various components, structures, etc., in the building model.

Additionally, it will be appreciated that COBie is an internationally recognized data exchange standard. COBie data includes building systems information between design and construction. COBie may be in different formats, such as an Excel format and/or an Excel spreadsheet format. In one example, the COBie data may be limited to a predetermined number of rows, such as a maximum of 65,536 rows. Additionally, the COBie data may also be COBieLite data in an extensible markup language (XML) format. COBie enables data relevant to building systems management to be quickly transferred to owner/operators of the building after the building is designed and constructed. Exemplary COBie data may include floor space, occupancy level, operation costs, maintenance schedule, energy use estimates, etc. It will be appreciated that COBie data may have a plethora of additional uses such as capturing survey information, documentation of maintenance issues, coordinating maintenance records, etc.

The COBie data can be color coded. Specifically, columns in the COBie data may be color coded in yellow, orange, purple, and green. The yellow color coding indicates a required data such a key, date, building information, etc. The orange color coding indicates reference and/or lookup data, such as a picklist, user, etc. The purple color coding indicates data that is automatically inserted by the system. Additionally, the green color coding indicates data that may be required if specified by the consumer or contract, for example. In this way, the COBie spreadsheet can be color coded according to a predetermined standard.

Additionally, the building model 210, the hierarchical structure of building model data 212, and the COBie spreadsheet 214 may be associatively liked via common identification data such as a common identification number. The BIM engine 204 may be configured to validate one or more cells in the COBie spreadsheet 214. Specifically, the BIM engine 204 may be configured to compare COBie data in the COBie spreadsheet 214 stored in a database 216 with predetermined validation requirements. Additionally, in one example, the validation may be implemented in real-time. It will be appreciated that versions of the building model 210 and/or hierarchical structure of building model data 212 may also be stored in the database 204.

A master client computing device 218 is also included in the BIM system 200. It will be appreciated that the master client computing device 218 may more generally be a client computing device in electronic communication with the BIM server 202 via the network 206. Additionally, the master client computing device 218 may be configured to access the GUI generated by the BIM engine 204. A network browsing program 220, such as a web-browser, may be used to access the GUI generated by the BIM engine 204, in one example. Additionally, the master client computing device 218 is configured to control the BIM engine 204. For instance, the master client computing device 218 is configured to input, delete, overwrite, etc., data in the building model 210, the hierarchical structure of building model data 212, and/or the COBie spreadsheet 214. In this way, the master client computing device 218 can remotely control the BIM engine 204 via the network connection. As a result, a user may access the BIM engine from a variety of remote locations, if desired.

The master client computing device 218 is also configured to send a save data command to the BIM engine 204. The save data command is configured to request associative mapping between identification data in each of the building model 210, a hierarchical structure of building model data 212, and the COBie spreadsheet 214. Additionally, a representation of the associatively mapped data may be stored in either the BIM server 202 and/or the master client computing device 218. The representation of the associatively mapped data may include viewing coordinates and/or vectors as well as a common identification number. Additionally, the representation of the associatively mapped data may not include graphical building data, in one example. Furthermore, the master client computing device 218 may include a database 219.

A plurality of slave client computing devices 222 are also included in the BIM system 200. Each of the slave client computing devices 222 is configured to passively access the BIM engine 204. Therefore in one example, the slave client computing devices 222 may be inhibited from controlling the BIM engine 204. Additionally, the slave client computing devices 222 may be configured to view a session with the BIM engine 204 controlled via the master client computing device 218. Specifically, network browsing programs 224 included in each of the slave client computing devices 222 may be configured to facilitate passive access to the BIM engine 204. In this way, a plurality of computing devices may access the BIM engine 204, enabling a meeting with remotely located participants to be implemented, if desired. Specifically, the slave client computing devices 222 may passively view the GUI 208. Additionally, the slave client computing device 222 may include databases 223.

The BIM server 202, master client computing device 218, and the slave client computing devices 222 each include memory 230 holding instructions executable by a processor 232. Therefore, it will be appreciated that the methods and other functionalities described herein with regard to the BIM server and client computing devices may be stored in memory executable by a processor. Moreover, it will be appreciated that the memory and the processor in each of the aforementioned devices may not be equivalent, in one example. Additionally, each of the master client computing device 218 and the slave client computing devices 222 includes a display 250 and an input device 252. The displays 250 are configured to present visual information and the input devices 252 are configured to provide data and control signals to the device in response to user input. Example displays include liquid crystal displays (LCDs), touch displays, OLED displays, etc. Example input devices include keyboards, trackpads, mice, touch interfaces, etc. It will be appreciated that the types of displays and/or input devices may vary between computing devices, in one example.

Figure 3:
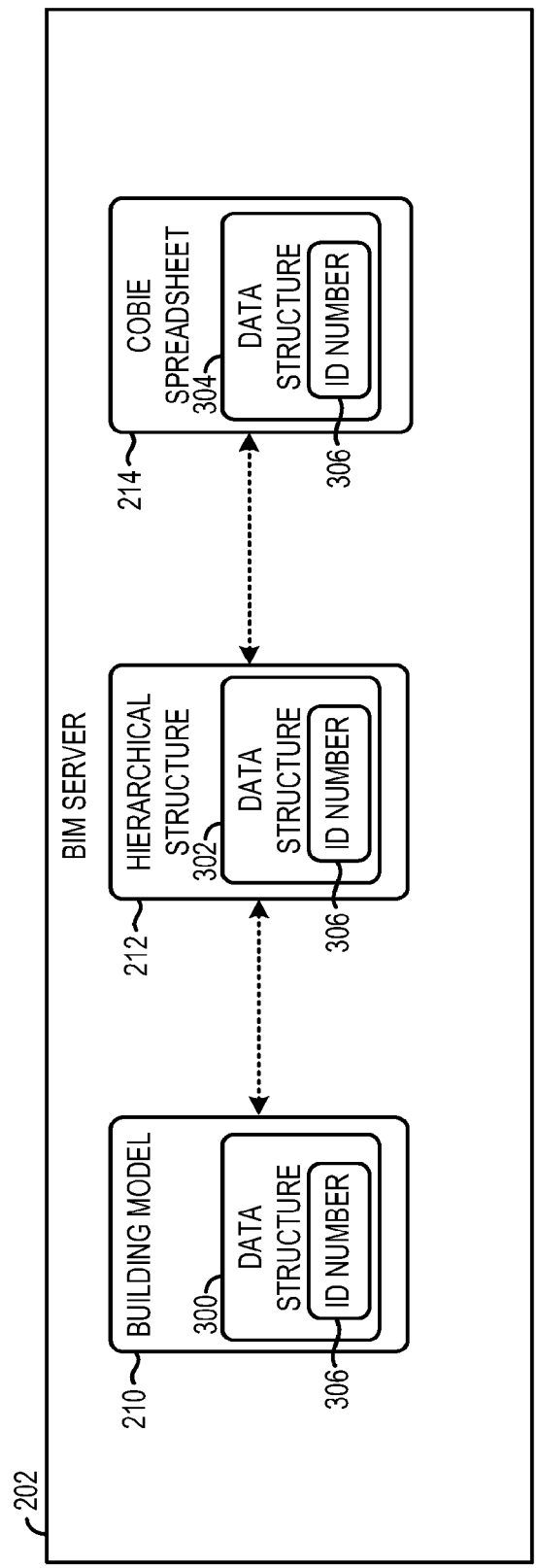
FIG. 3 shows a more detailed view of the BIM server shown in FIG. 2.

FIG. 3 shows an example of how data is linked in the BIM server 202. Again, the building model 210, hierarchical structure 212, and COBie spreadsheet 214 are shown. Each of the building model 210, hierarchical structure 212, and COBie spreadsheet 214 includes data structures 300, 302, and 304, respectively. These data structures each include a common identification number 306. Additionally or alternatively, in other examples other types of identification data may be used such as a bar codes, QR codes, etc. The common identification number enables these three separate data structures to be linked for retrieval and viewing. In one example, the COBie spreadsheet and the hierarchical structure are generated from a source file (e.g., a source Industry Foundation Classes (IFC) file) and when generating the COBie spreadsheet and the hierarchical structure the spreadsheet and structure may be appended with a Globally Unique Identifier (GUID). In this way, identifiers can be used to link the hierarchical structure and COBie spreadsheet. It will be appreciated that the building model can be linked to the other data structures in this same way.

At step 402 of FIG. 4, a user of the master device 106, shown in FIG. 1 opens a model, (e.g., by creating a new model or loading BIM-based data from an existing file). This can involve connecting to the server device 102 by a world wide web (WWW) browser running on the master device and accessing a webpage and application that interacts with the code executing on the server device, for example. This may involve the user providing a user identifier and password. Subsequently, the user may then select a "create/load new model" option or the like. After this, at step 404, the master device sends a message to the server device indicating that a new session is to be created. At step 406 the server device creates the new session and at step 408 the server device transfers an identifier for the session, which is received by the master device at step 410.

After the session identifier has been received, at step 412 the master device 106 requests the model data as currently stored by the server device 102 and at step 414 this request is received by the server device. At step 415, the server device transfers the model data and it is received by the master device at step 416. At step 418, the master device checks whether all the model data has been received/finished loading; if not then the method returns to step 412 to continue transfer of the model data. When the model data has finished loading then the process of the master device creating the session can end at step 419.

If the user of the master device 106 wants to invite one of the slave devices 108, e.g. device 108A, to join the session so that the user of that slave device can collaborate in relation to the model then at step 420 the master device user selects an appropriate option on the web page/application for sending an invitation to the slave device. At step 422, the invitation is received at the slave device, which is also in communication with the server device 102 web page and/or application (e.g., after logging in by providing a username and password). The invitation may include the session identifier and at step 424 the user of the slave device can accept the invitation and a message is sent to the server device (received at step 426) indicating that the slave device is joining the session as a client. This may result in the identifier of the model accessed by the master device being retrieved and at step 428 the identifier is sent to the slave device. At step 430 the slave device requests the model data corresponding to the identifier from the server device. The server device then performs steps 414 and 415 as described above, but in relation to the slave device rather than the master device, with the slave device receiving the model data at step 432. At step 434, the slave device checks whether all the model data has been received/finished loading; if not then the method returns to step 430 to continue transfer of the model data. When the model data has finished loading then the process of the slave device joining the session can end at step 436.

Figure 5:
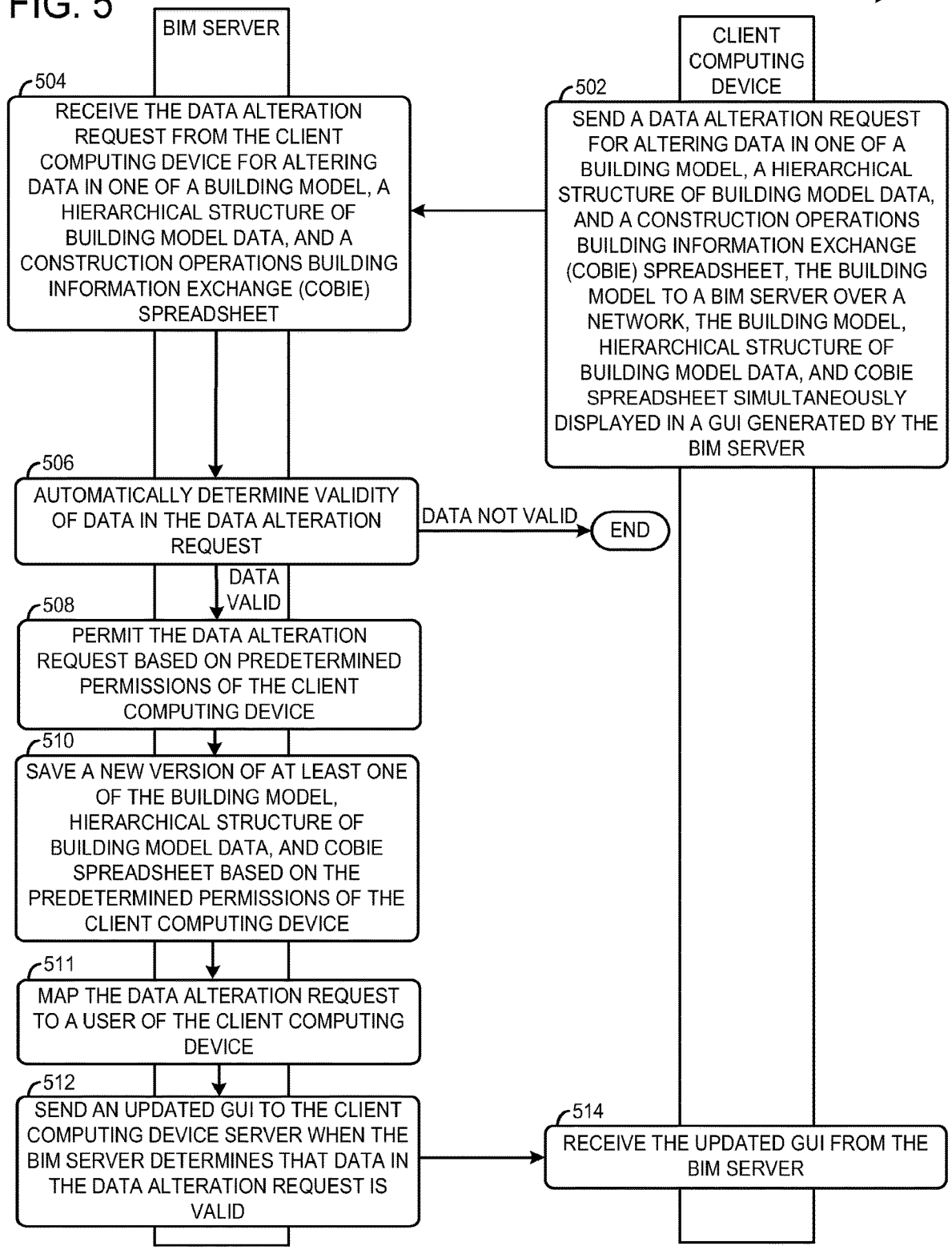
FIG. 5 shows a method for operating a BIM system.

FIG. 5 shows a method 500 for operation of a BIM system. The BIM system may be the BIM system 200 discussed above with regard to FIG. 2, in one example. However, in another example other suitable BIM systems may be used to implement the method 500.

At 502 the method includes, at the client computing device, sending a data alteration request for altering data in one of a building model, a hierarchical structure of building model data, and a construction operations building information exchange (COBie) spreadsheet, the building model to a BIM server over a network, the building model, hierarchical structure of building model data, and COBie spreadsheet simultaneously displayed in a GUI generated by the BIM server. In one example, the network is the Internet. Further in one example, the hierarchical structure of building model data is a hierarchical tree structure with a root value and sub-trees of children, represented as a set of linked nodes. In another example, the building model includes a 3-dimensional rendering of a structure. In yet another example, the COBie spreadsheet data is formatted (e.g., color coded) according to a predetermined standard.

At 504 the method includes, at the BIM server, receiving the data alteration request from the client computing device for altering data in one of a building model, a hierarchical structure of building model data, and a COBie spreadsheet. Next at 506 the method includes, at the BIM server, determining validity of data in the data alteration request. In one example, where determining the validity of the data in the data alteration request is implemented in real-time. In one example, automatically determining validity of data in the data alteration request may include iterating over each field in the alteration request and checking that one or more of the fields pass a predetermined rule. For instance, fields in the alteration request may be checked for matching of entries in other data sheets such as an entry in a contact sheet. The alteration request may also be checked that the date(s) provided in the request are valid and/or that the installation date field is filled in. Still further in one example, automatically determining validity of data in the data alteration request may include enforcing referential integrity of the data through use of a validation lookup list. Referential integrity is an asset of data which requires a value of one attribute (e.g., column) of a table to exist as a value of another attribute in a different table.

If it is determined that the data in in the data alteration request is not valid the method ends. However, if it is determined that the data in the data alteration request is valid the method advances to 508. At 508 the method includes permitting the data alteration request based on predetermined permissions of the client computing device. In one example, permitting the data alteration request includes implementing data alteration in one of building model, hierarchical structure of building model data, and COBie spreadsheet. In this way, data can be altered in any of the tri-dimensional data structures. Further in one example, data in each of the building model, hierarchical structure of building model data, and COBie spreadsheet is altered in response to permitting the data alteration request in one of the building model, hierarchical structure of building model data, and COBie spreadsheet. Still further in one example, the predetermined permissions include permitting data alteration in only one of the building model, hierarchical structure, and the COBie spreadsheet.

Next at 510 the method includes, at the BIM server, saving a new version of at least one of the building model, hierarchical structure of building model data, and COBie spreadsheet based on the predetermined permissions of the client computing device. At 511 the method includes mapping the data alteration request to a user of the client computing device. In this way, the data alteration can be linked to a specific user of a computing device enabling tracking of data changes for subsequent review of the data. Further in one example, the user details, date/time of the data alteration, and the changed data itself (e.g., delta/difference). Furthermore, the data alterations can be easily rolled back by removing the alteration.

At 512 the method includes, at the BIM server, sending an updated GUI to the client computing device server when the BIM server determines that data in the data alteration request is valid. It will be appreciated that the BIM server generates an updated GUI based on the data alteration request prior to step 512. Additionally in one example, the updated GUI includes new graphical data in one of the building model, hierarchical structure of building model data, and COBie spreadsheet. Next at 514 the method includes at the client computing device receiving the updated GUI from the BIM server.

FIGS. 6-12 show various example GUI's which may be generated via the BIM engine 204 and accessed via the network browsing programs (220 and 224) included in the client computing devices (218 and 222), discussed above with regard to FIG. 2.

Figure 6:
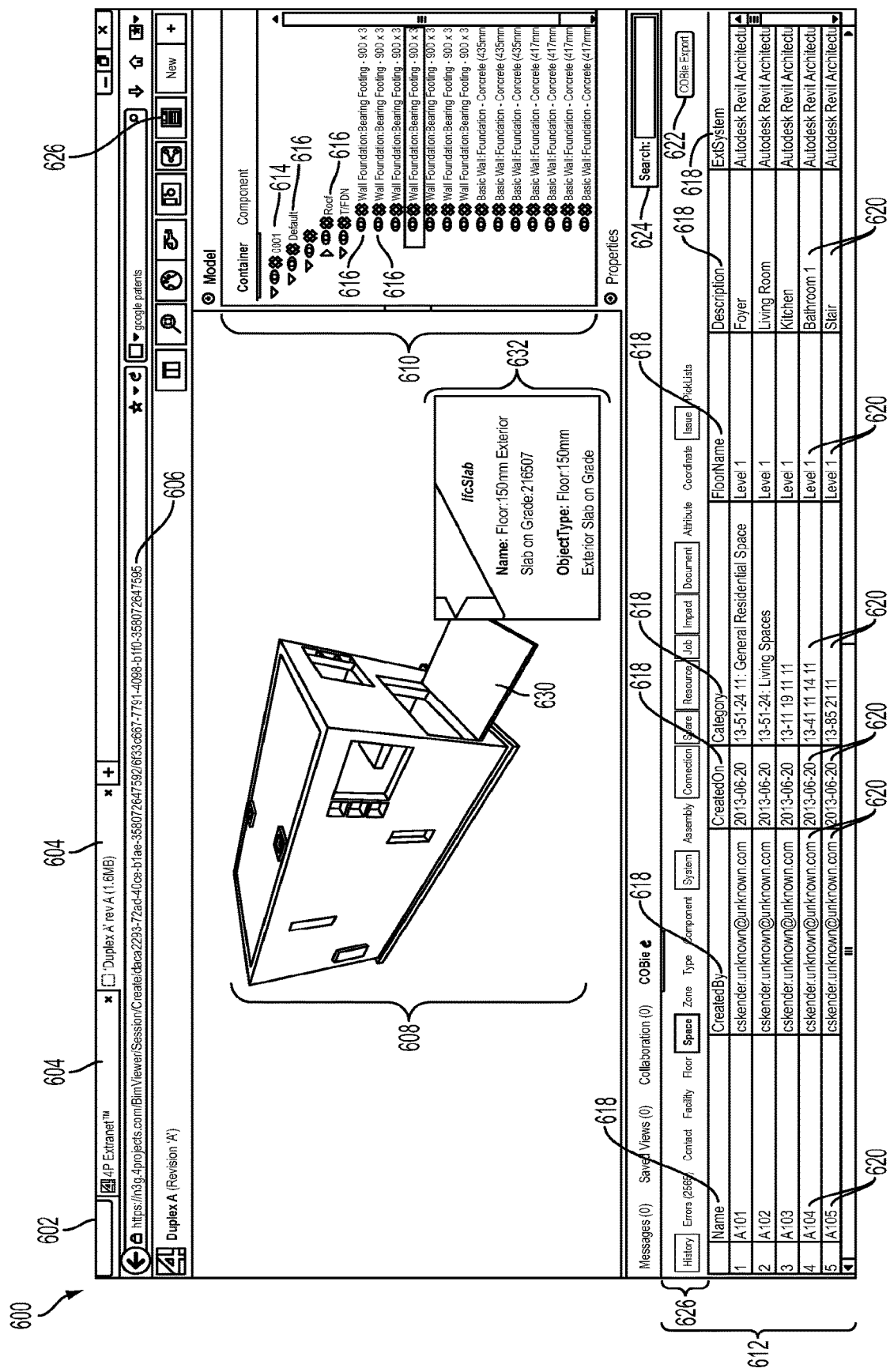

Specifically, FIG. 6 shows a GUI 600 included in a browser window 602. It will be appreciated that the browser window 602 may executed on a client computing device such as the master client computing device 218 and the slave client computing devices 222, shown in FIG. 2.

The browser window 602 may include tabs 604 and a network address field 906. The network address field 606 enables the browser to access the BIM engine 204, shown in FIG. 2, via the network 206, shown in FIG. 2. The GUI 600 includes a building model 608, a hierarchical structure of building model data 610, and a COBie spreadsheet 612. The building model 608 includes graphical representations of building objects, structures, etc., such as walls, windows, roofs, etc. Additionally, the hierarchical structure of building model data 610 includes directories 614 and sub-directories 616. The directories and sub-directories are related to objects in the building model. In this way, a user may easily disseminate how objects in the model are conceptually organized in a data structure. Each of the directories and sub-directories may include icons and alphanumeric symbols. Specifically, in one example the hierarchical structure of building model data 610 is a hierarchical tree structure with a root value and sub-trees of children, represented as a set of linked nodes. The directories may be the root value and the sub-trees of children may be the sub-directories.

The COBie spreadsheet 612 includes categories 618 and category fields 720. The category fields may be more generally referred to as cells. The cells may be populated by data entered via a user. The categories 618 may include an object name, a name of the creator of the object, a date of object creation, a floor name, a description of the object, and/or an associated external system. The category fields 620 include COBie formatted data. Additionally, the COBie spreadsheet may be color coded based on the type of data in the spreadsheet field. As previously discussed, the COBie data may be validated via a BIM engine. It will be appreciated that interaction with one of the building model 608, the hierarchical structure of building model data 610, and the COBie spreadsheet 612 may initiate changes in the other two features. In this way, information across these data sets may be linked. It will be appreciated that each of the aforementioned features are bounded in panels adjacent to one another, in the depicted example. Specified objects such as roofs, floors, stairs, and walls are arranged in a tree structure in the depicted example. Each of the objects may have a specific identification number.

Further in one example, clicking an object (e.g., structural item) in the 3-dimensional building model brings the structural item into view in the hierarchical structure and displays the objects COBie data in the COBie spreadsheet. Likewise, clicking the item on the hierarchical structure with display the item's COBie data on COBie spreadsheet and highlight the item in the 3-dimensionial building model. A COBie export 622 button is also provided in the GUI 600 to enable COBie data to be exported to other computing devices, systems, etc. A search tool 624 is also provided in the GUI 600. Categories 626 such as history, errors, contact, facility, floor, space, zone, type, component, system, assembly, connection, spare, resource, job, impact, document, attribute, coordinate, issue, and PickLists are also provided in the GUI. A save button 628 may also be configured to generate a save command that may be sent to the BIM server to initiate storing of various data associated with each of the building model, the hierarchical structure, and the COBie spreadsheet, as previously discussed.

In one example, some objects in the building model 608 are made partially transparent to facilitate viewing of interior objects. Thus, an x-ray option that can be activated allowing a user to view interior structures of the building model through the walls. Further in one example, the GUI 600 may shows an interior view of the building model as witnessed by the 3-dimensional camera that is configured to move around the 3D image in a plurality of manners including an orbiting mode and a helicopter mode.

Additionally, the GUI 600 shows how hovering over an item or clicking an object 630 in the 3D viewer will display certain information 632 related to that item in the 3D viewer. Such information may include but not be limited to: item name, item dimensions, item serial number, color, creation date, and creator name.

Figure 7:
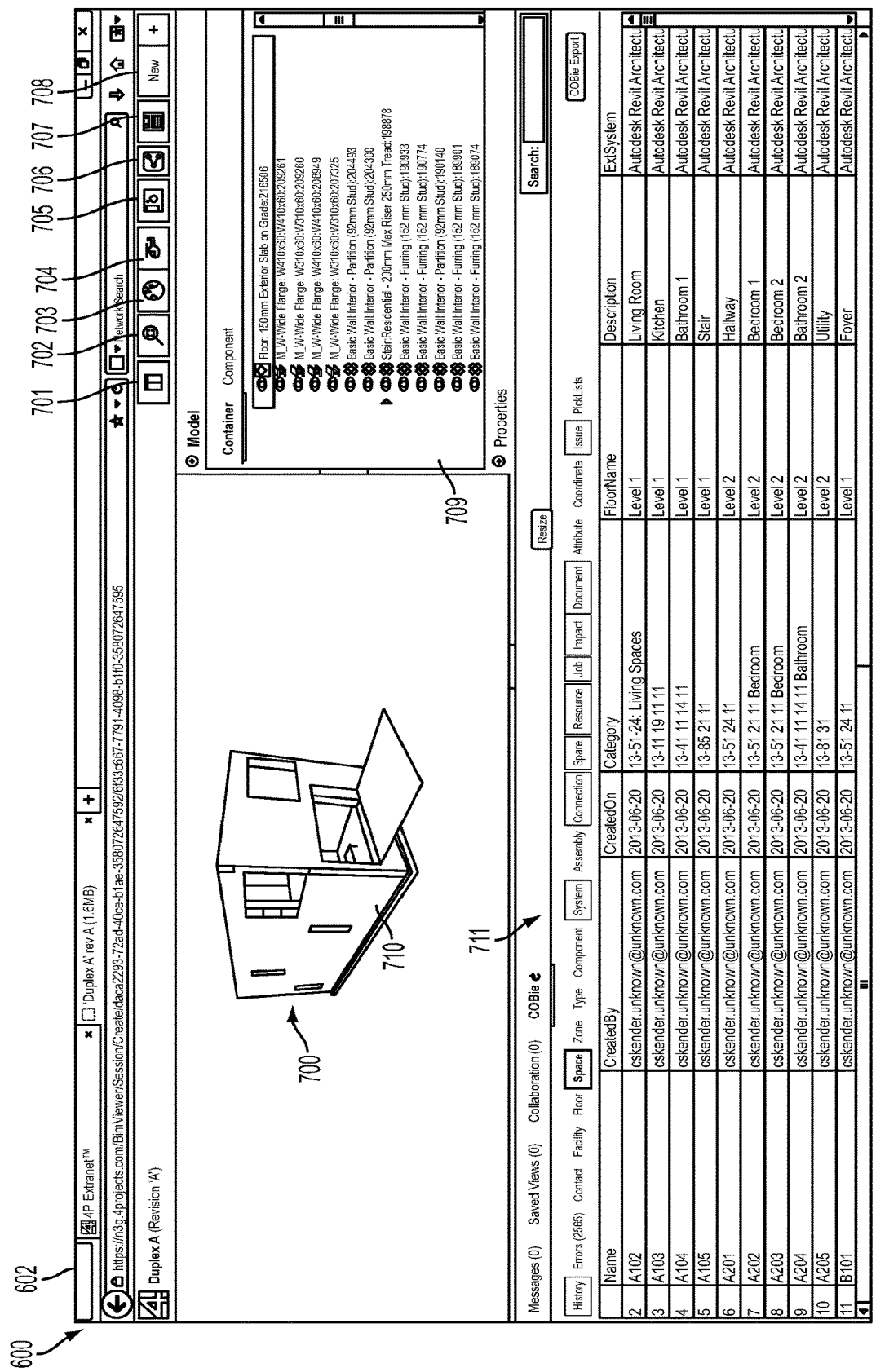

FIG. 7 shows another aspect of the GUI 600 included in the browser window 602. Specifically, FIG. 7 details optional tools within the interface for accessing the building model. 700 indicates a 3D viewer. 701 indicates an x-ray view button. 702 indicates a zoom tool. 703 indicates a camera orbiting mode button. 704 indicates a helicopter camera viewing button. 705 indicates a button that takes a screenshot. 706 indicates a button that creates a shared session between the current BIM viewer and another user. 707 indicates a button that saves a current view point in the building model so that a user can return to the viewpoint at a later time. This effectively stores the state of the viewer in terms of parameters like current camera position, visibility state, camera mode (e.g., orbit, helicopter, etc.,) xray mode, etc. The button, indicated at 707, also take a thumbnail screenshot of the viewpoint so that the user can visualize the saved view, in one example. A button may also be provided in the GUI 800 which enables the user to save changes in the COBie data. 708 indicates a button that allows the user to make a new task or discussion relating to the building model. Tasks and discussions may include but not be limited to titles, screenshots, dates, deadlines, folders, names of responsible individuals, location, and text editing features like highlighting and fonts. 709 indicates a hierarchical structure (e.g., item tree) for the structure of interest; items may be organized by type, floor, location, or other sub categories. 710 indicates the 3-D building model. 711 indicates the COBie spreadsheet panel containing COBie data related to the structure of interest.

Figure 8:
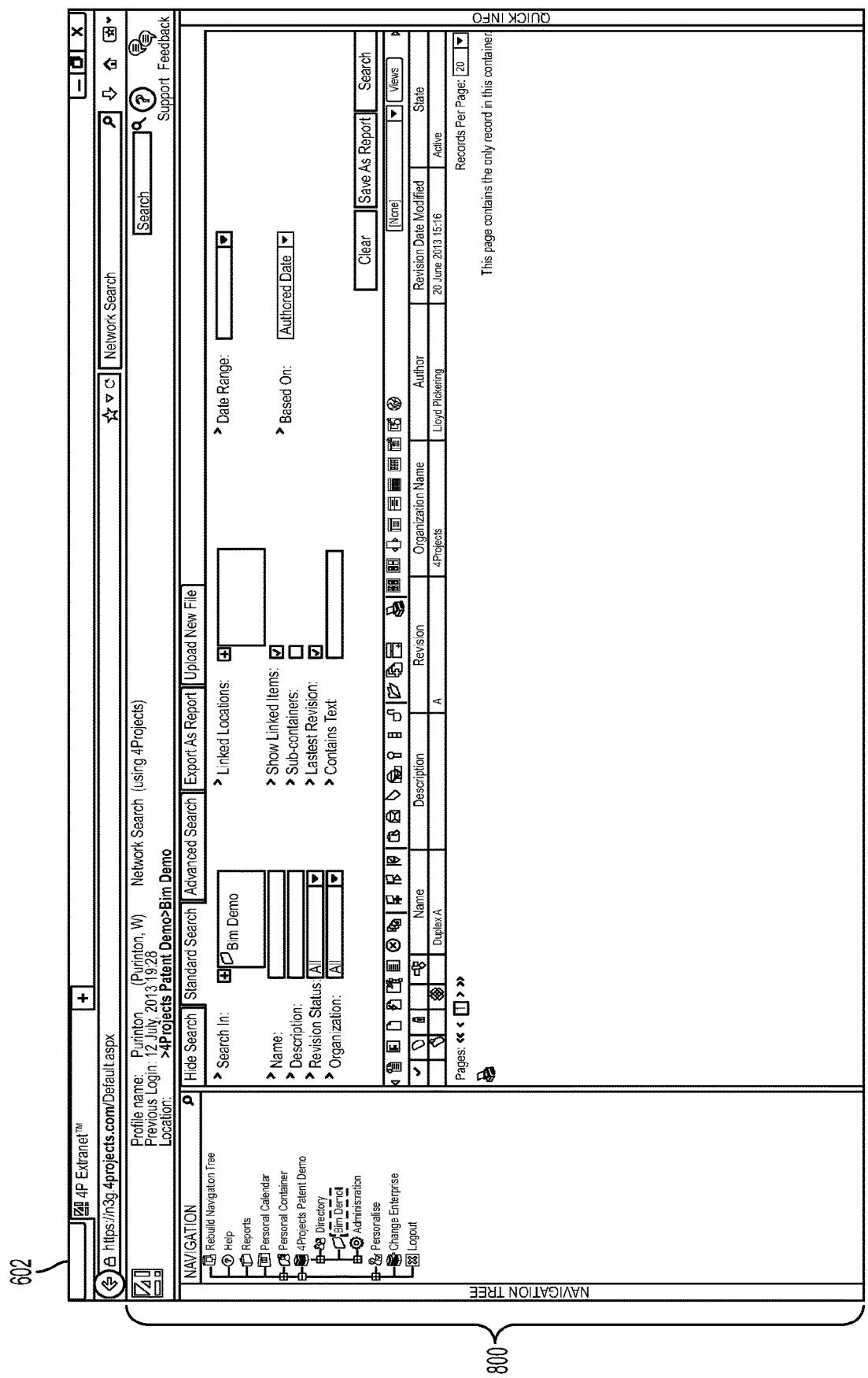

FIG. 8 is an example of an access page 800 that allows a user to access the BIM viewer. The access page 800 is presented in the browser window 602. A user can log into the web site with a username and password to verify that they are authorized to have access to certain BIM information and content. In this way, the building model, COBie spreadsheet, and hierarchical structure can be accessed online. This allows one user to manage multiple projects and schedules related to those projects. Additionally, fields are provided in the access page 800 to enable a user to select various stages of project revisions as well as link items in the project to other files.

Figure 10:
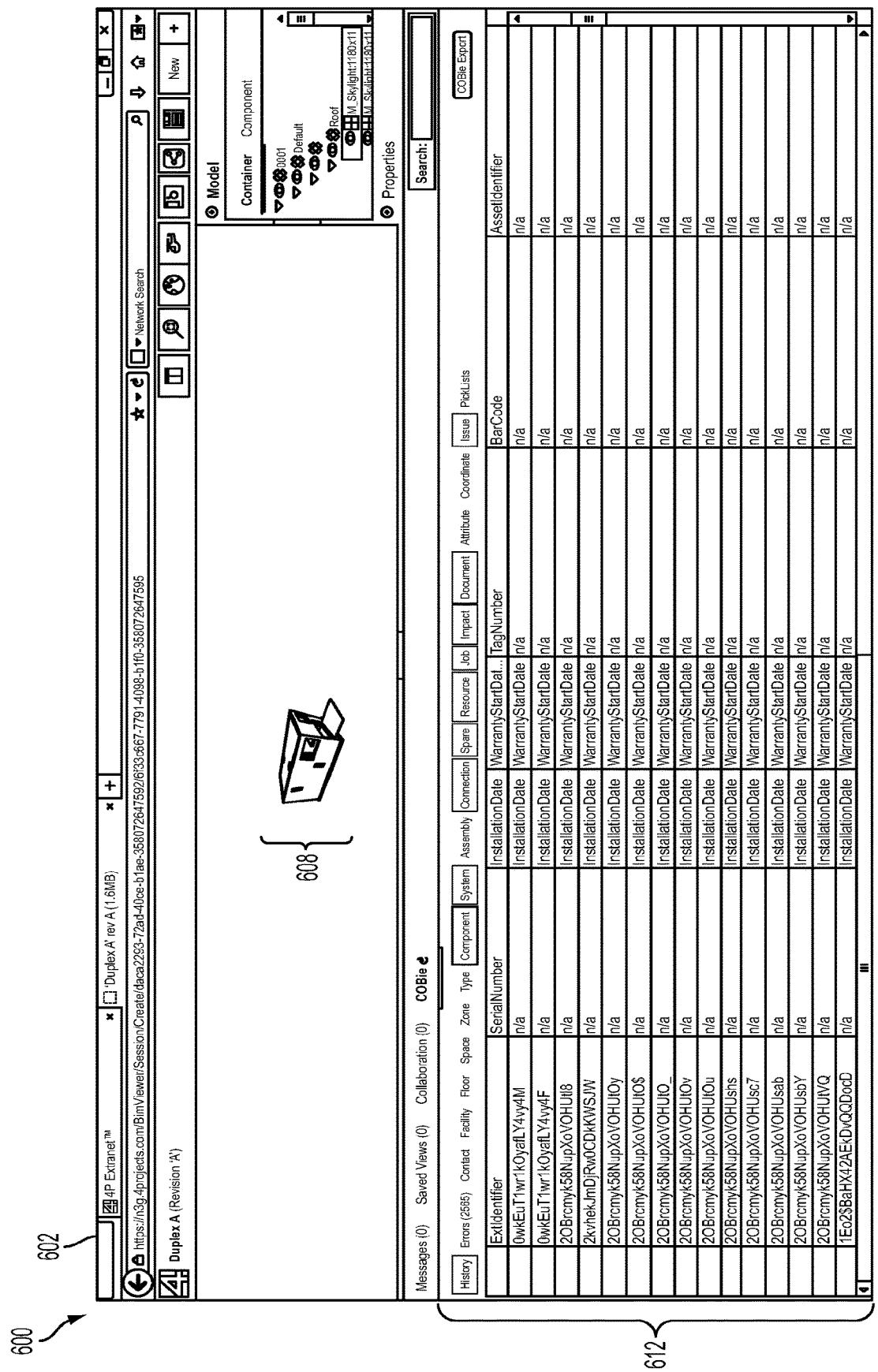
Figure 11:
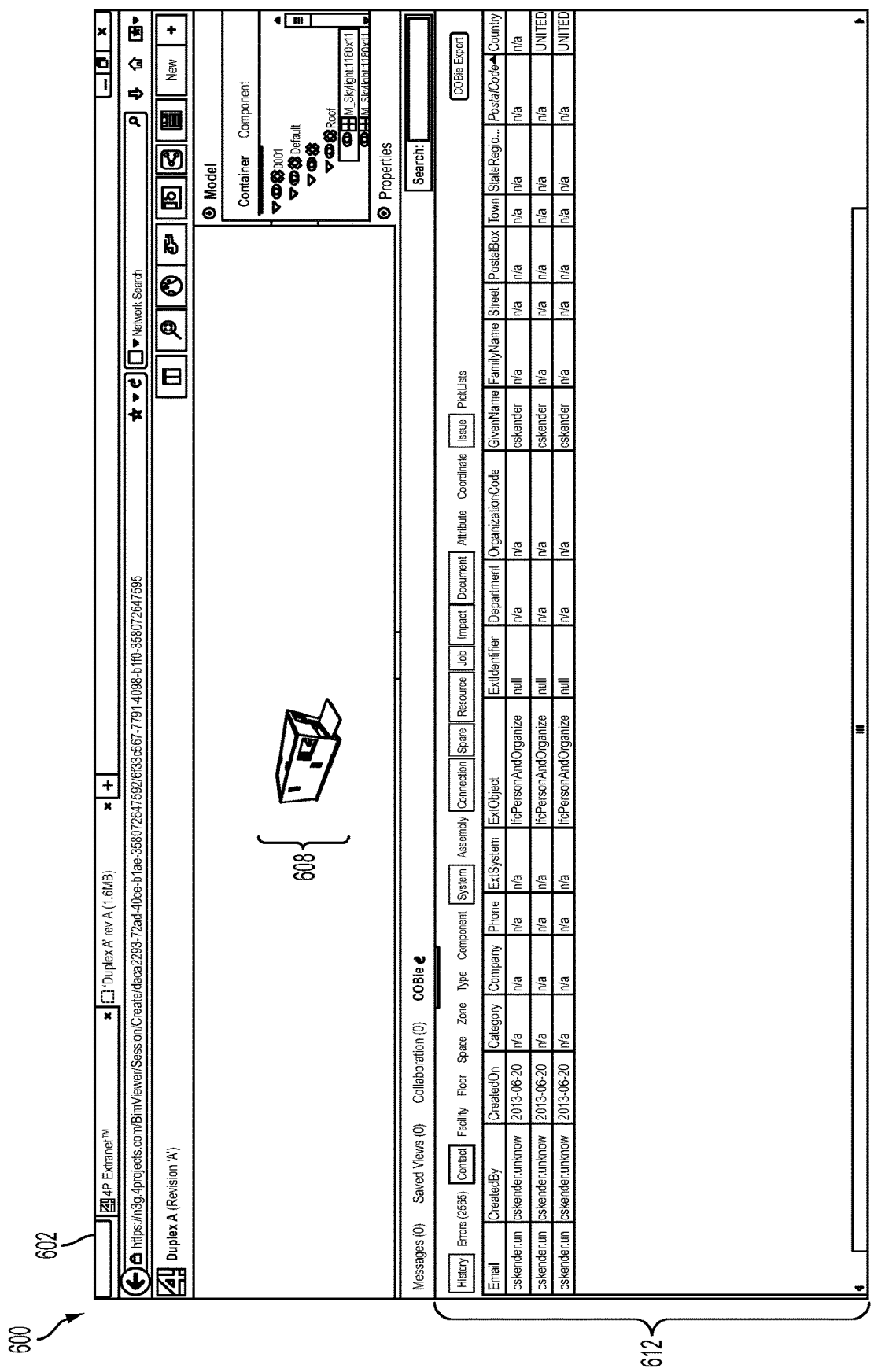
Figure 12:
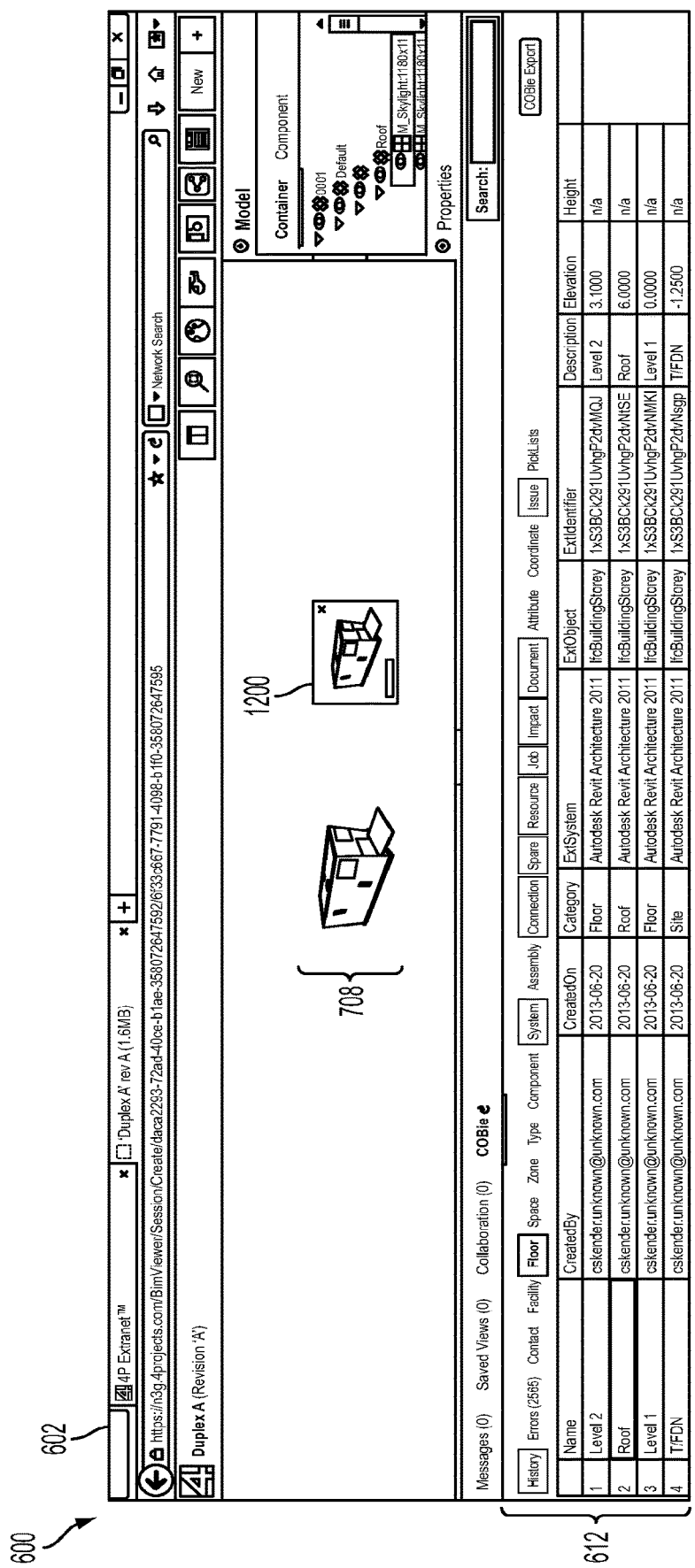

FIGS. 9-12 show other aspects of the GUI 600 in the browser window 602. Specifically, FIGS. 9-12 show different displayable options that can be viewed in the COBie spreadsheet 612 pertaining to items within the building model 608, matters and information pertaining to the building model, and information that may connect the building model to other building models. This information can be displayed in any order or arrangement in addition to other information that may also be pertinent to the user's purposes within the realm of variation that an individual of normal skill in the art would have access to. Specifically, FIGS. 9-10 show the COBie spreadsheet 612 populated with data related to components in the model. FIG. 11 shows the COBie spreadsheet 612 populated with data related to contacts associated with object in the model. FIG. 12 show the COBie spreadsheet 612 populated with data related to floors in the building model.

FIG. 12 additionally shows the use of saved screenshots 1200 or saved camera positions, both possible within the embodiments of the system, for quickly navigating the 3D model and for presentation purposes. It will be appreciated that a user if a client computing device may initiate saving the screenshots through interactive input with the GUI 600. In one example, the BIM engine may provide an item view deactivation option where individual objects may be selected in the hierarchical structure and made temporarily invisible in the 3D viewer for better viewing of the 3D building model.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method performed by one or more computing systems for setting up a session for sharing building information modeling (BIM)-based data, the method comprising:
   receiving from a master device a request to create a session associated with a building model;
   sending to the master device a session identifier, wherein when the master device receives the session identifier, the master device sends to a slave device an invitation to join the session, the invitation including the session identifier;
   transferring to the master device building model data;
   receiving from the slave device a message indicating that the slave device is joining the session;
   upon receiving the message, transferring to the slave device the building model data;
   receiving from the master device data relating to an update of the building model data; and
   sending to the slave device the data relating to the update.

2. The method of claim 1 further comprising generating a graphical user interface (GUI) displaying the building model, a hierarchical structure of the building model data, and a Construction Operations Building Information Exchange (COBie) spreadsheet.

3. The method of claim 2 further comprising generating an updated GUI based on the data relating to the update.

4. The method of claim 1 wherein the update of the building model data includes one or more of changing a viewing angle of the building model, changing visibility of certain model features, selecting items of the building model, and adding comments or chat messages.

5. The method of claim 1 further comprising determining validity of the data relating to the update.

6. The method of claim 5 wherein determining the validity of the data includes one or more of checking a date validity of dates in the data and actively enforcing referential integrity of the data through use of a validation lookup list.

7. The method of claim 5 further comprising when it is determined that the data relating to the update is not valid, not sending to the slave device the data relating to the update.

8. The method of claim 1 wherein a second slave device joins the session and further comprising transferring to the second slave device the building model data and the data relating to the update to ensure that the second slave device has up-to-date data.

9. The method of claim 1 further comprising authenticating a user of the master device using a user identifier and a password.

10. The method of claim 1 further comprising authenticating a user of the slave device using a user identifier and a password.

11. The method of claim 1 wherein the master device is configured to control the session.

12. The method of claim 11 wherein the slave device is configured to view the session controlled by the master device and inhibited from controlling the session.

13. One or more computing systems for setting up a session for sharing building information modeling (BIM)-based data, the one or more computing systems comprising:
   one or more computer-readable storage mediums storing computer-executable instructions for controlling the one or more computing systems to:
      receive from a master device a request to create a session associated with a building model;
      send to the master device a session identifier;
      transfer to the master device building model data;
      when one or more slave devices join the session, transfer to the one or more slave devices the building model data;
      receive from the master device data relating to an update of the building model data; and
      send to the one or more slave devices the data relating to the update; and
   one or more processors for executing the computer-executable instructions stored in the one or more computer-readable storage mediums.

14. The one or more computing systems of claim 13 wherein the computer-executable instructions further control the one or more computing systems to generate a graphical user interface (GUI) displaying the building model, a hierarchical structure of the building model data, and a Construction Operations Building Information Exchange (COBie) spreadsheet.

15. The one or more computing systems of claim 14 wherein the computer-executable instructions further control the one or more computing systems to generate an updated GUI based on the data relating to the update.

16. The one or more computing systems of claim 13 wherein the computer-executable instructions further control the one or more computing systems to update the building model, a hierarchical structure of the building model data, and a Construction Operations Building Information Exchange (COBie) spreadsheet based on the data relating to the update of the building model data.

17. A method performed by one or more computing systems for setting up a session for sharing building information modeling (BIM)-based data, the method comprising:
    accessing a building model;
    sending to a server a message indicating that a new session is to be created;
    receiving from the server a session identifier;
    receiving from the server building model data;
    sending to a slave device an invitation to join the session, the invitation including the session identifier;
    updating the building model data; and
    sending to the server the updated data, wherein the server sends the updated data to the slave device.

18. The method of claim 17 wherein accessing the building model includes creating a new model or loading an existing model.

19. The method of claim 17 wherein in response to receiving the invitation to join the session, the slave device sends to the server a message indicating that the slave device is joining the session.

20. The method of claim 17 further comprising sending to the server a save data command wherein the save data command is configured to request associative mapping between identification data in each of the building model, a hierarchical structure of the building model data, and a COBie spreadsheet.

* * * * *

UNITED STATES PATENT AND TRADEMARK OFFICE
CERTIFICATE OF CORRECTION

PATENT NO. : 10,915,671 B2
APPLICATION NO. : 16/664586
DATED : February 9, 2021
INVENTOR(S) : Laurence Skoropinski et al.

Page 1 of 1

It is certified that error appears in the above-identified patent and that said Letters Patent is hereby corrected as shown below:

On the Title Page

In item (56), in Column 2, under "Other Publications", Line 3, delete "Faitech" and insert -- Fiatech --, therefor.

In item (56), in Column 2, under "Other Publications", Line 3, delete "www,youtube,com/" and insert -- www.youtube.com/ --, therefor.

On the page 2, in Column 1, under "Other Publications", Line 1, delete "Kimona" and insert -- Kimon --, therefor.

In the Specification

In Column 8, Line 33, delete "in in" and insert -- in --, therefor.

In Column 9, Line 66, delete "3-dimensionial" and insert -- 3-dimensional --, therefor.

Signed and Sealed this
Sixth Day of September, 2022

Katherine Kelly Vidal
*Director of the United States Patent and Trademark Office*